(12) United States Patent
Ein-Eli et al.

(10) Patent No.: US 7,494,936 B2
(45) Date of Patent: Feb. 24, 2009

(54) METHOD FOR ELECTROCHEMICAL ETCHING OF SEMICONDUCTOR MATERIAL USING POSITIVE POTENTIAL DISSOLUTION (PPD) IN SOLUTIONS FREE FROM HYDROGEN FLUORIDE (HF)

(75) Inventors: Yair Ein-Eli, Haifa (IL); David Starosvetsky, Yokneam (IL); Joseph Yahalom, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 166 days.

(21) Appl. No.: 11/129,578

(22) Filed: May 16, 2005

(65) Prior Publication Data

US 2006/0254928 A1    Nov. 16, 2006

(51) Int. Cl.
*H01L 21/302*    (2006.01)
*H01L 21/461*    (2006.01)
(52) U.S. Cl. .......................... 438/745; 438/42; 438/93; 205/655; 205/656; 204/242
(58) Field of Classification Search ................ 438/745, 438/42, 93; 205/655, 656; 204/242; 437/228
See application file for complete search history.

(56) References Cited

U.S. PATENT DOCUMENTS 5,445,718 A * 8/1995 Wang ......................... 205/646
6,521,118 B1   2/2003 Starosvetsky et al.

2005/0148198 A1    7/2005 Ein-Eli et al.

FOREIGN PATENT DOCUMENTS

DE          40 36 895    *   5/1992

OTHER PUBLICATIONS

R. A. Wind et al., Orientation-resolved chemical kinetics: using microfabrication to unravel the complicated chemistry of KOH/Si etching, J. Phys. Chem B.106(7), 1557-1569 (2002).
I. Zubel and M. Kramkowska, The effect of isopropyl alcohol on etching rate and roughness of (1 0 0) Si surface etched in KOH and TMAH solutions, Sensors and Actuators A. Physical, A93(2). 138-147 (2001).

* cited by examiner

*Primary Examiner*—Binh X Tran
*Assistant Examiner*—Mahmoud Dahimene
(74) *Attorney, Agent, or Firm*—Edward Langer, Esq; Shibolet & Co.

(57) ABSTRACT

A method for electrochemical etching of a semiconductor material using positive potential dissolution (PPD) in solutions that do not contain hydrofluoric acid (HF-free solutions). The method includes immersing an as-cut semiconductor material in an etching solution, and positive biasing at atypically highly positive (anodic) potentials, thereby significantly increasing the value of the anodic current density (measured as A/cm$^2$) of the semiconductor material. The application of positive biasing at atypically highly positive (anodic) potentials, is combined with specifically controlling and directing illumination on the semiconductor material surface contacted and wetted by the etching solution. This is done for a necessary and sufficient period of time to enable a positive synergistic effect on the rate and extent of etching of the semiconductor material therefrom.

10 Claims, 12 Drawing Sheets

METHOD FOR ELECTROCHEMICAL ETCHING OF SEMICONDUCTOR MATERIAL USING POSITIVE POTENTIAL DISSOLUTION (PPD) IN SOLUTIONS FREE FROM HYDROGEN FLUORIDE (HF)

FIELD OF THE INVENTION

The present invention relates to methods for etching semiconductor materials based on applying positive (anodic) potentials during conditions of wet etching in solutions free from hydrogen fluoride, and more particularly, to a method for forming, polishing and texturing a semiconductor material using the technique of positive potential dissolution (PPD).

BACKGROUND OF THE INVENTION

The development of a simple, reliable, inexpensive and environmentally friendly process of silicon etching is of significant practical importance to the semiconductor industry. Various methods of silicon etching were developed in the last three decades Typically, existing silicon etching methods, involving polishing and texturing, based on PPD is performed in media containing hydrofluoric acid (HF). The etching is combined with the process of photolithography. Such an electrochemical technique involves combining positive (anodic) biasing of the silicon that is exposed to (contacted and wetted by) an aggressive HF etching solution, with possible illumination of the positively biased exposed silicon surface, and is reasonably effective for increasing control and the rate of the silicon etching/texturing process. However, the use of media containing HF is undesirable because it is accompanied by serious environmental issues relating to its handling and disposal.

Slow silicon texturing based on anisotropic etching is usually performed in alkaline solutions that are free from HF, for example, NaOH or KOH solutions, during relatively long term exposure of the silicon surface at open circuit potential (OCP), without electrical biasing. This is because positive (anodic) biasing of silicon in alkaline solutions results in inactivation and/or deactivation of the silicon surface, so that etching, and therefore, texturing or polishing stops. Typical etching rates in KOH at open circuit are below 1 microns/min {e.g., R. A Wind et al., J. Phys. Chem. B, 106, 1557-1569 (2002), I. Zubel and M. Kramkowska, Sensors and Actuators A, Physical, A93(2), 138-147 (2001)}. Attempting to increase the rate of etching and texturing of the silicon by using positive (anodic) biasing of the exposed silicon surface results in working in a region within which the treated material (silicon and/or metal) becomes passive or inactivated, or actively dissolves and becomes deactivated. Thus, except when etching/texturing silicon in HF solutions, positive (anodic) biasing has not been in use.

Thus, it would be highly advantageous to have a method for fast etching (polishing/texturing) a semiconductor material using the technique of positive potential dissolution (PPD), based on applying atypically highly positive (anodic) potentials during conditions of wet etching, and continued etching (polishing/texturing) of a semiconductor material formed therefrom. Such a method is generally commercially applicable to a variety of related fields and sub-fields.

SUMMARY OF THE INVENTION

Accordingly, it is a principal object of the present invention to provide a method for fast etching (polishing/texturing) a semiconductor material using the technique of positive potential dissolution (PPD) at a rate of at least 5 microns/min.

It is another object of the present invention to provide a method for etching (polishing/texturing) using a technique based on applying atypically highly positive (anodic) potentials during conditions of wet etching, and an etched (polished/textured) semiconductor material formed therefrom.

It is a further object of the present invention to provide a method for etching (polishing/texturing) a semiconductor material, comprising simple and inexpensive steps.

It is a further object of the present invention to provide a method for fast etching (polishing/texturing) a semiconductor material, using non-toxic chemicals.

The method of the present invention provides a technique of positive potential dissolution (PPD), based on applying positive (anodic) potentials higher than +10 volts relative to a reference electrode, such as a saturated calomel electrode (SCE). In particular, application is made of a range of potentials between about plus 10 volt and plus 75 volts relative to a reference electrode, such as a SCE, during conditions of wet etching. Application of the potential may be combined with illumination of the positively biased exposed silicon surface, allowing silicon etching. The rate of silicon etching (texturing/polishing) in alkaline media, for example, KOH solutions, could be significantly increased by using high positive (anodic) biasing, above passive potentials of the silicon that is exposed to (contacted and wetted by) the alkaline etching solution, with or without illumination of the positively biased exposed silicon surface.

The present invention is generally applicable to a wide variety of semiconductor materials at various conditions, for example, different types of polished semiconductor materials, and different types of "as cut" unpolished semiconductor materials. The present invention is generally applicable to a variety of different industrial fields and subfields requiring or involving polishing or texturing the surface of semiconductor materials and polished or textured semiconductor materials formed therefrom, and is particularly applicable to the field of microelectronics, microelectromechanical systems (MEMS) and the manufacturing of solar cells or photovoltaic panels from semiconductor materials, involving texturing surfaces of the semiconductor materials for the objective of decreasing reflectance of incident sunlight away from the semiconductor material surfaces.

The present invention relates to a method for etching (polishing/texturing) a semiconductor material using the technique of positive potential dissolution (PPD), based on applying atypically highly positive (anodic) potentials during conditions of wet etching, and a textured/polished semiconductor material formed. The rate and extent of etching of the semiconductor material, and therefore, the degree of polishing and texturing of semiconductor material formed, are controllable and significantly influenced by the several primary operating conditions and parameters of the positive potential dissolution (PPD) technique: the type of the semiconductor material; semiconductor crystallinity, electrolyte concentration, temperature and flow rate of the etching solution; magnitude and duration of the positive biasing; and by the semiconductor type and crystallographic orientation, light intensity of at least 0.01 watts per $cm^2$, or less than 0.01 watts per $cm^2$, respectively), wavelength and duration of illumination incident upon the positive biased semiconductor material surface exposed to the etching solution. This illumination requirement is not essential in all cases.

The method is specifically designated for:
 a stand-alone method for etching (polishing or texturing) a semiconductor material;

as part of a more encompassing multi-stage method for processing or manufacturing a semiconductor material; or combined in a bath where the counter electrode is a semiconductor as well, and allowing on this counter electrode a NPD (Negative Polarization Dissolution) process as outlined in U.S. Pat. No. 6,521,118 and U.S. patent application Ser. No. 10/750,969, the disclosures of which are herein incorporated by reference.

In a preferred embodiment of the present invention, the positive potential dissolution (PPD) texturing method features subjecting a polished material, or an as-cut, semiconductor material to an etching solution. The method also includes positive biasing at atypically highly positive (anodic) potentials, more positive than plus 10 volts relative to a Saturated Calomel Electrode. The specifically controlled and directed illumination of the positively biased semiconductor material surface contacted and wetted by the etching solution free from HF increases the value of the anodic current density (A/cm$^2$) of the semiconductor material.

Accordingly, in this preferred embodiment, the positive biasing at atypically highly positive (anodic) potentials, preferably but not essentially, combined with specifically controlling and directed illumination by light of the semiconductor material surface contacted and wetted by the etching solution, for a period of time, corresponds to a positive synergistic effect on the rate and extent of etching of the semiconductor material, and therefore, on the type of etched semiconductor material formed therefrom.

Secondly, in the case of an "as cut" unpolished semiconductor material, the positive potential dissolution (PPD) etching method features subjecting the material to an etching solution and positive biasing at atypically highly positive (anodic) potentials, during non-specifically controlled and, preferably but not essentially, directed illumination by unprocessed surrounding or background ambient light, incident upon the positively biased "as cut" unpolished semiconductor material. The non-specifically controlled and directed illumination of the negatively biased "as cut" unpolished semiconductor material has no measurable affect upon the value of the anodic current density (A/cm$^2$) of the "as cut" unpolished semiconductor material, or upon the rate and extent of etching of the "as cut" unpolished semiconductor material, and therefore, upon the type of etched "as cut" unpolished semiconductor material formed.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF A PREFERRED EMBODIMENT

The principles and operation of a method and an apparatus according to the present invention may be better understood with reference to the drawings and the accompanying description, it being understood that these drawings are given for illustrative purposes only and are not meant to be limiting.

Figure 1:
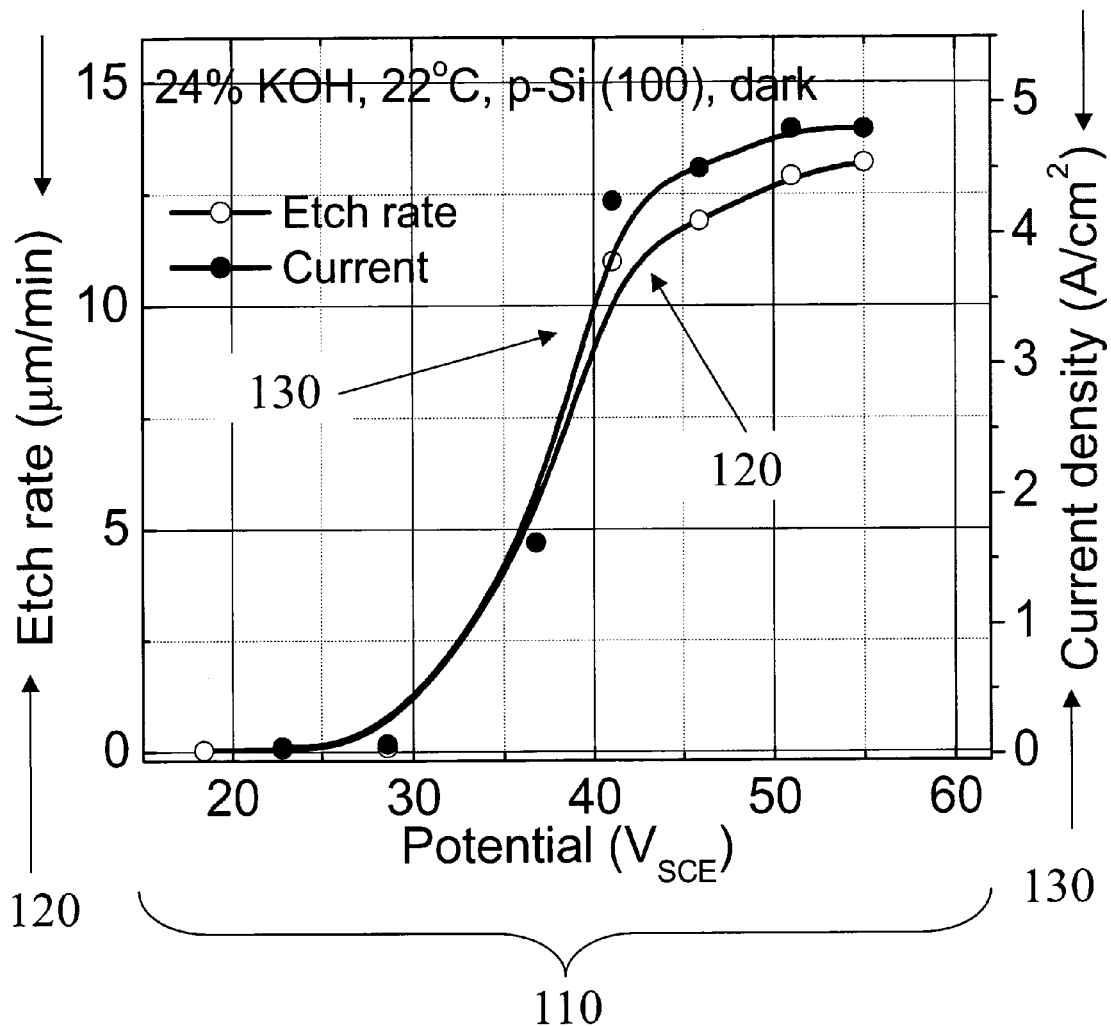
FIG. 1 is a graph of the effect of applied potential on etch rate and current density of p-type Si [(100) surface orientation] in 24 wt % KOH, constructed in accordance with the principles of the present invention.

FIG. 1 is a graph of the effect of applied potential 110 on the etch rate 120 and current density 130 of p-type Si [(100) surface orientation] in 24 wt % KOH, constructed in accordance with the principles of the present invention. Silicon is being rapidly etched in solutions (e.g., aqueous, nonaqueous1 molten salts and inorganic media) under an applied positive potential higher than 10 V. FIG. 1 presents both etching rate 120 and current density 130 of p type silicon in a solution of 24 wt % KOH performed in the dark. Etching rates 120, measured by weight loss evaluation, and measured current density 130 are seen to generally coincide and present similar profiles. It can also be seen that both etching and current increase as potential is increased from 20 V [vs. saturated calomel electrode (SCE) reference Electrode]. Below this value neither etching nor current are recorded. Shifting the potential to values higher than 25 V causes a dramatic increase in etch rate 120 and current density 130 measured. Etching rate 120 increases from a value of less than 1 micrometer/min., at 25 V, to 10 microns/min. at a potential of 40 V. The same trend is observed with current density 130 measured at the different potentials. At a potential of 25 V measured current density 130 was recorded as less than 25 mA/cm$^2$, while at a potential of 40 V current density 130 soared to a value of 3.5 A/cm$^2$.

Figure 2:
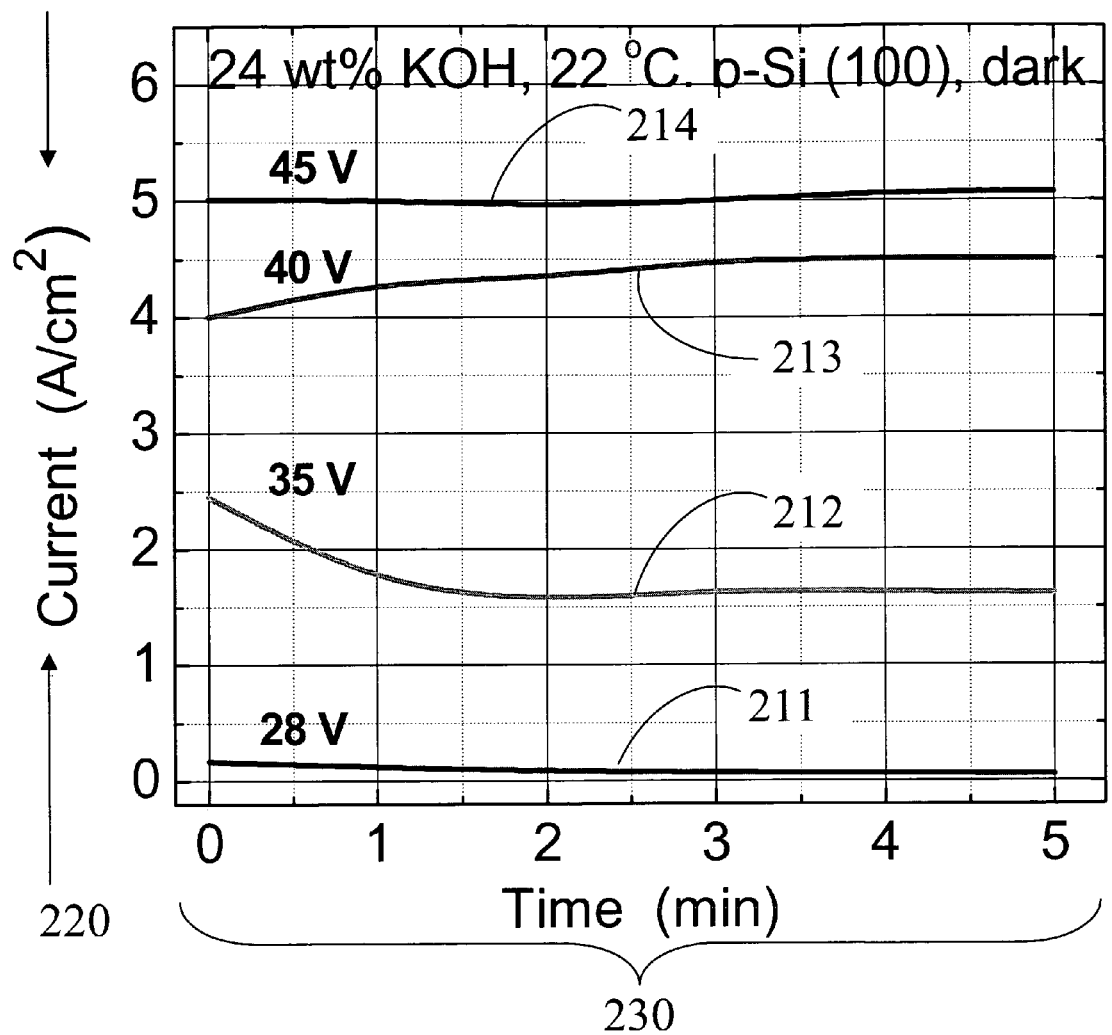
FIG. 2 is a graph of current density vs. time, with p-type Si [(100) surface orientation] in 24 wt % KOH at different applied potentials, constructed in accordance with the principles of the present invention.

FIG. 2 is a graph of current density vs. time, with p-type Si [(100) surface orientation] in 24 wt % KOH at different applied potentials, constructed in accordance with the principles of the present invention. FIG. 2 presents current time transients recorded at different positive potentials 211-214 (between 28 and 45 V), with the use of p-type silicon polarized in 24 wt % KOH at room temperature. As can be seen, at 28 V 211, the current 220 recorded increased initially to 100 mA/cm$^2$, and within a time 230 of 3 minutes fades to a minimum value of 20 mA/cm$^2$. Once potential 210 is increased to 35 V 212, current 220 at t+0 soared to 2.5 A/cm$^2$, slowly decreasing to a plateau value of 1.6 A/cm$^2$. At potentials of 40 V 213 and 45 V 214, current 220 measured are 4 and 5 A/c m$^2$, respectively. Thus, as potential 210 increases, response current 220 increases dramatically as well.

Figure 3:
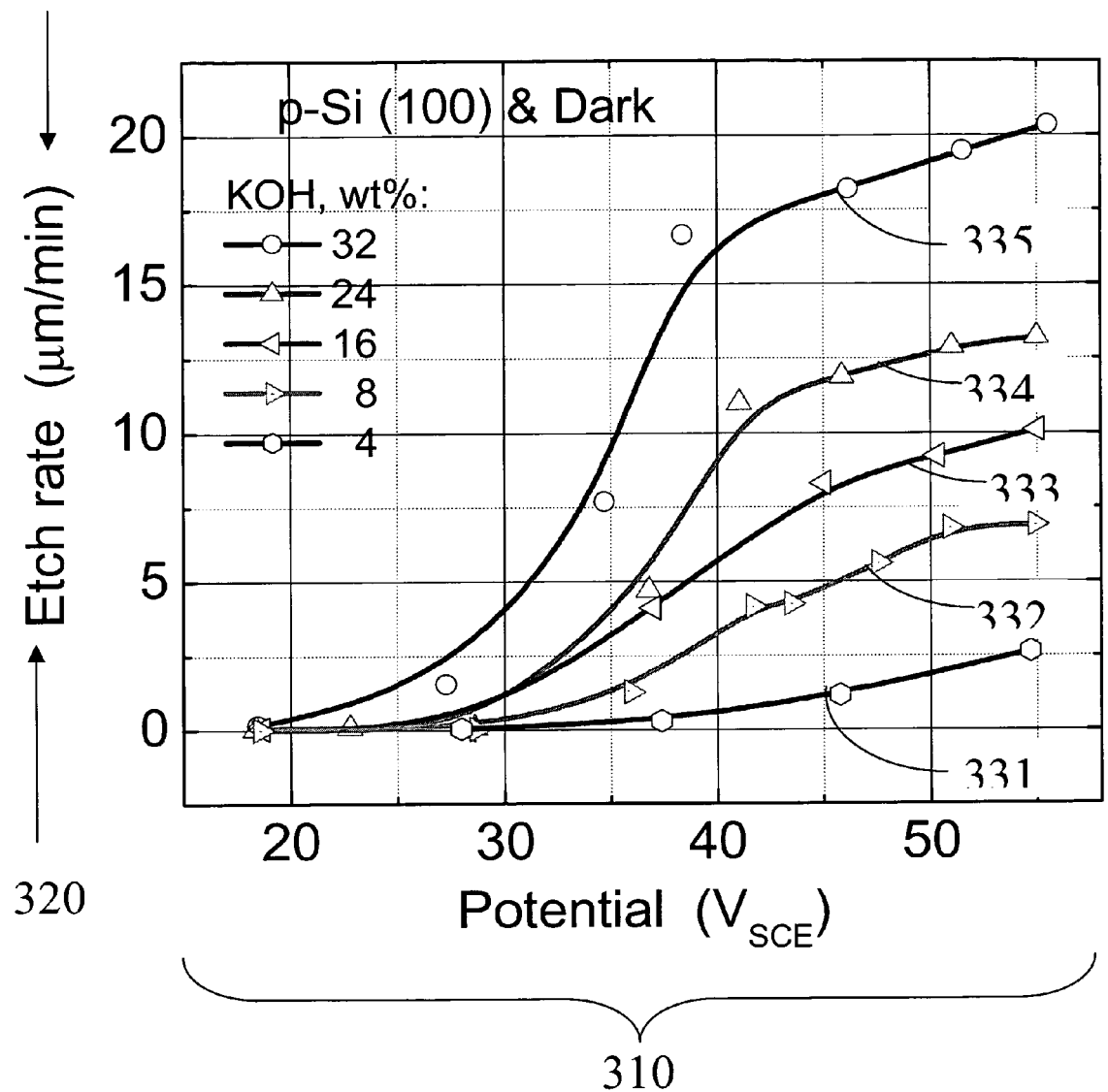
FIG. 3 is a graph of the effect of applied potential on an etch rate of p-type Si [(100) surface orientation] in solution with different KOH concentrations, constructed in accordance with the principles of the present invention.

FIG. 3 is a graph of the effect of applied potential 310 on an etch rate 320 of p-type Si [(100) surface orientation] in solution with different KOH concentrations 331-335 ranging between 4 and 32 wt %, constructed in accordance with the principles of the present invention. As can be seen, PPD can be "ignited" even with a low content of KOH electrolyte. This would occur at higher potentials, above 35 V. On the other hand with the use of 32 wt % electrolyte concentration 335, the PPD etching of the silicon surface starts at a potential of 20 V, at a much earlier stage. Thus, as one can observe, as the concentration of the alkaline in solution increases, the potential at which PPD initiates is lower. Etching rates 320 of more than 20 microns/min were recorder at a potential of 55 V in a solution containing 32 wt % 335.

Figure 4:
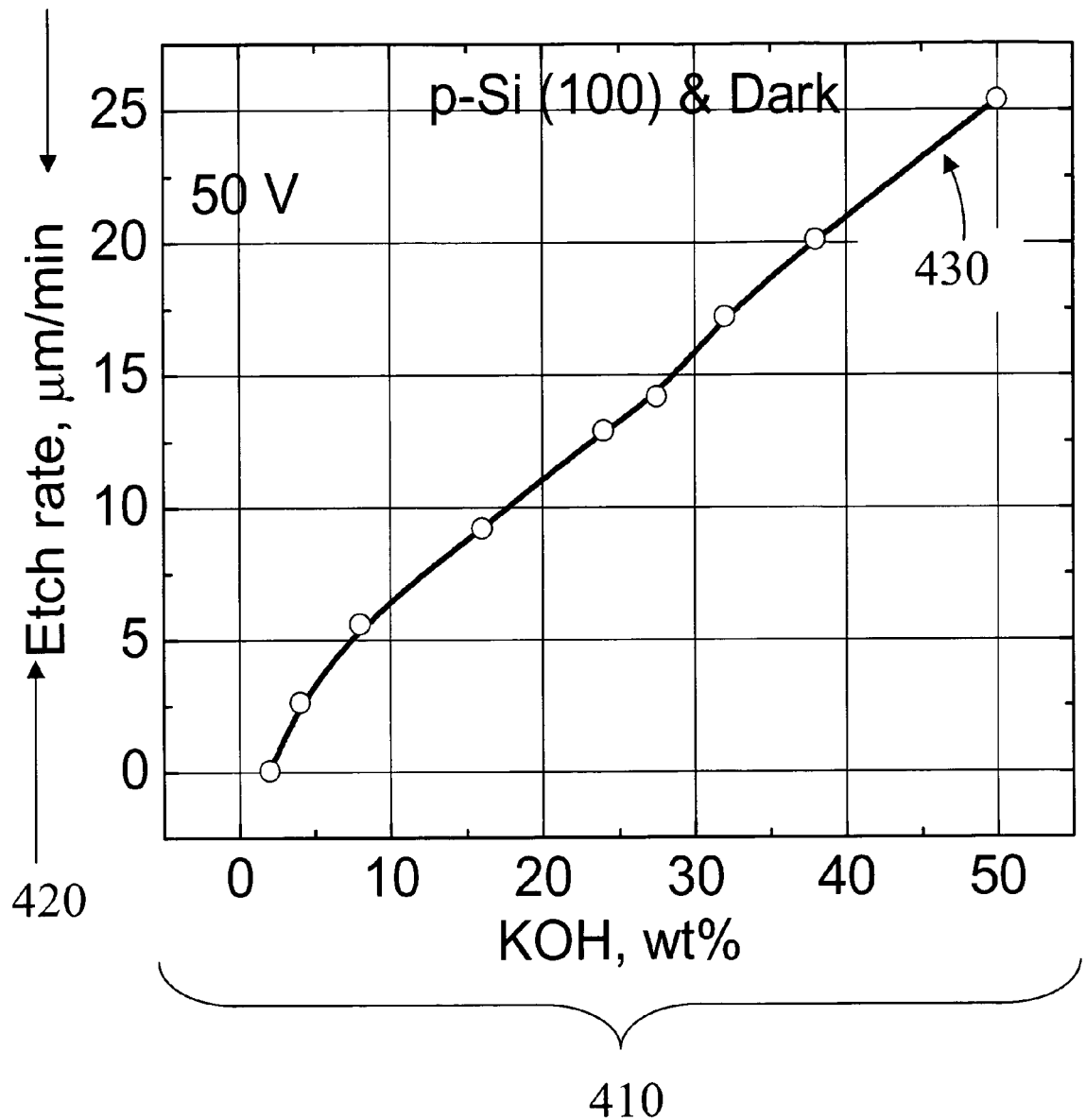
FIG. 4 is a graph of the effect of KOH concentration on an etch rate of p-type Si [(100) surface orientation] at the applied potential of 50 V, constructed in accordance with the principles of the present invention.
Figure 5A:
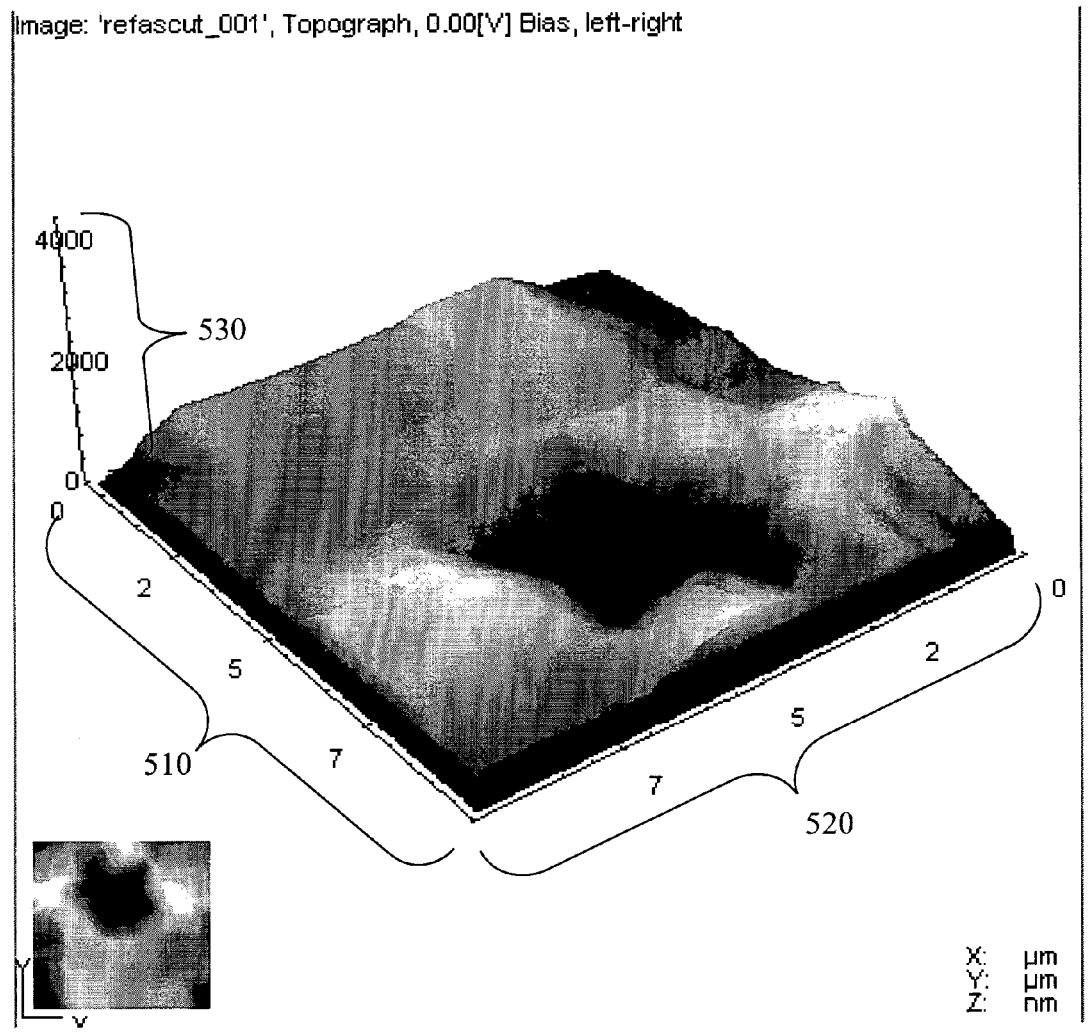
FIGS. 5a-5d are atomic force microscope (AFM) images of "as cut" silicon wafer after positive potential dissolution (PPD) silicon and presenting the capability to polish [an] as-cut surfaces.
Figure 5B:
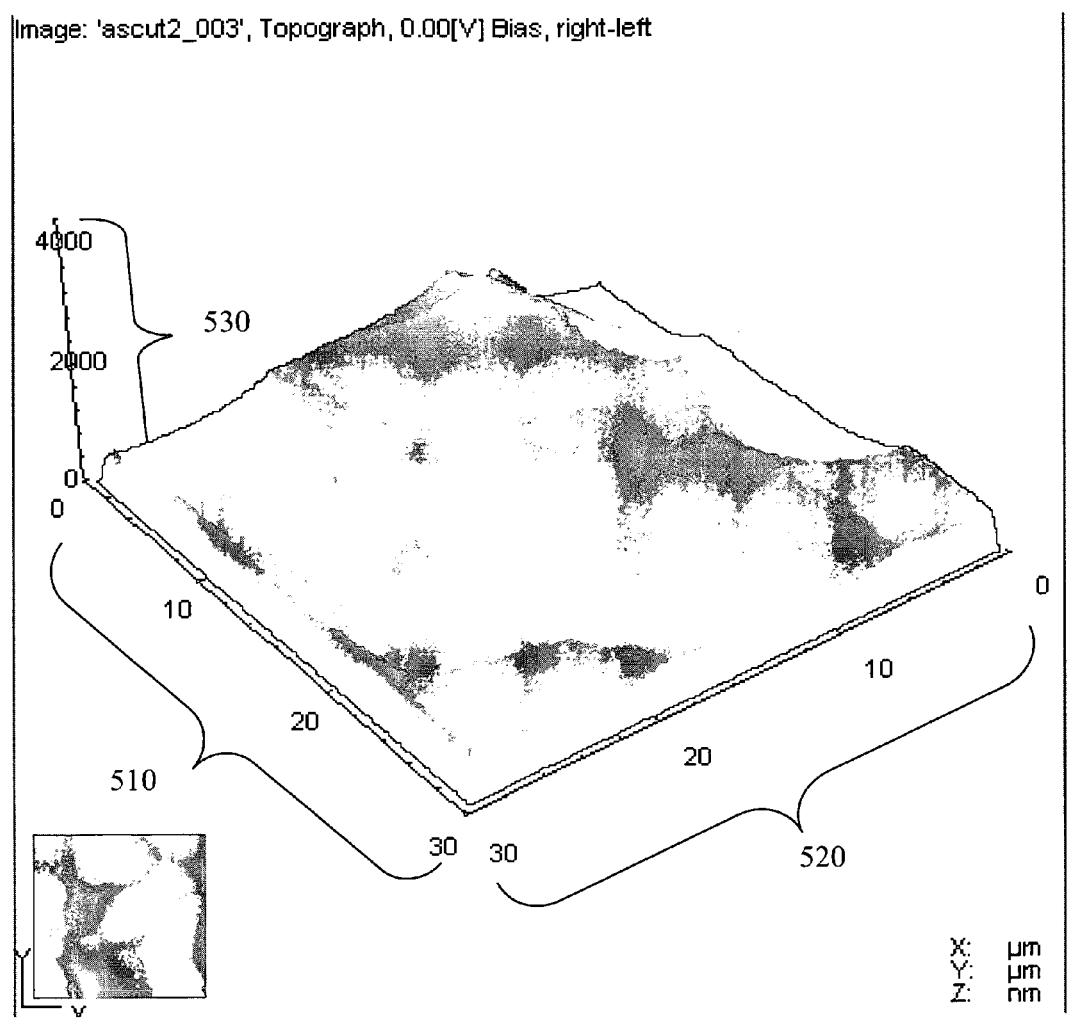
Figure 5C:
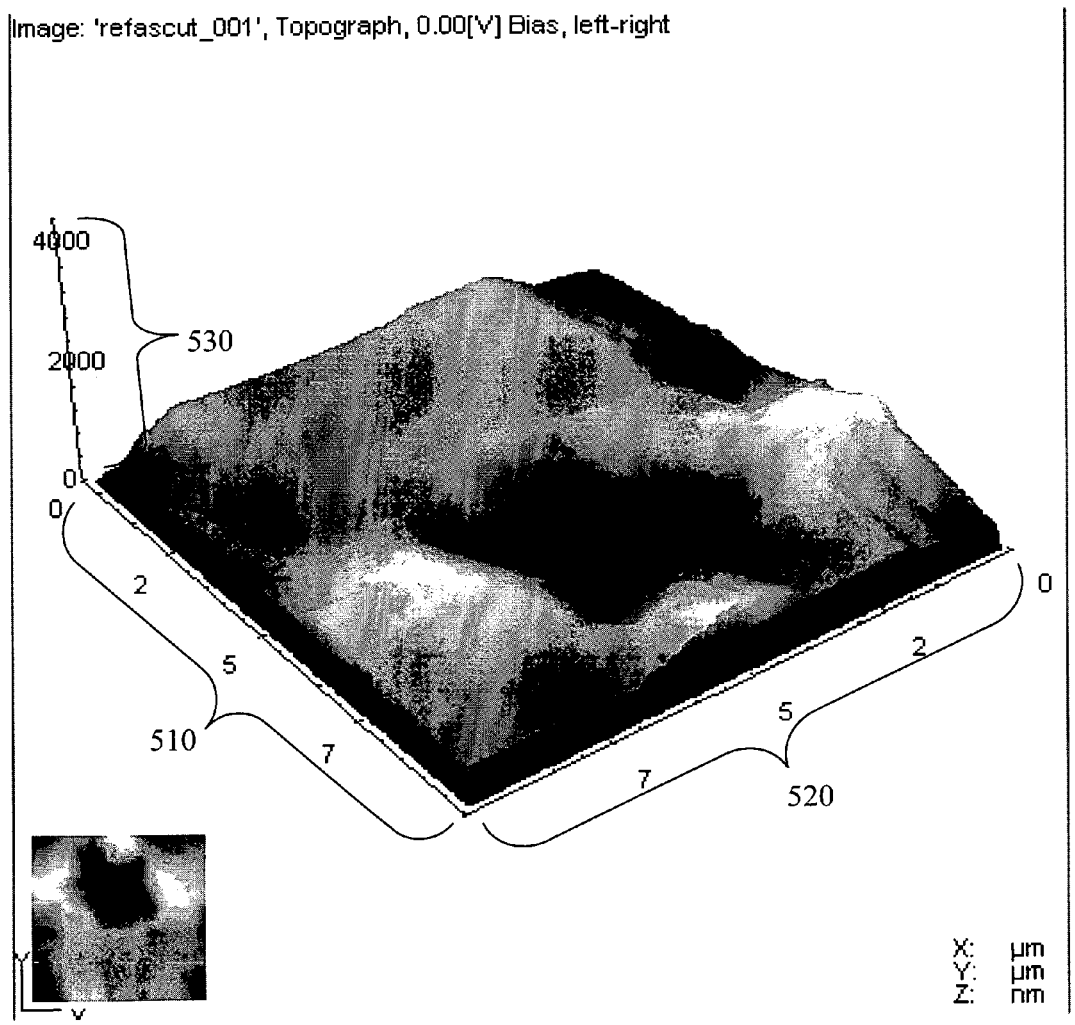
Figure 5D:
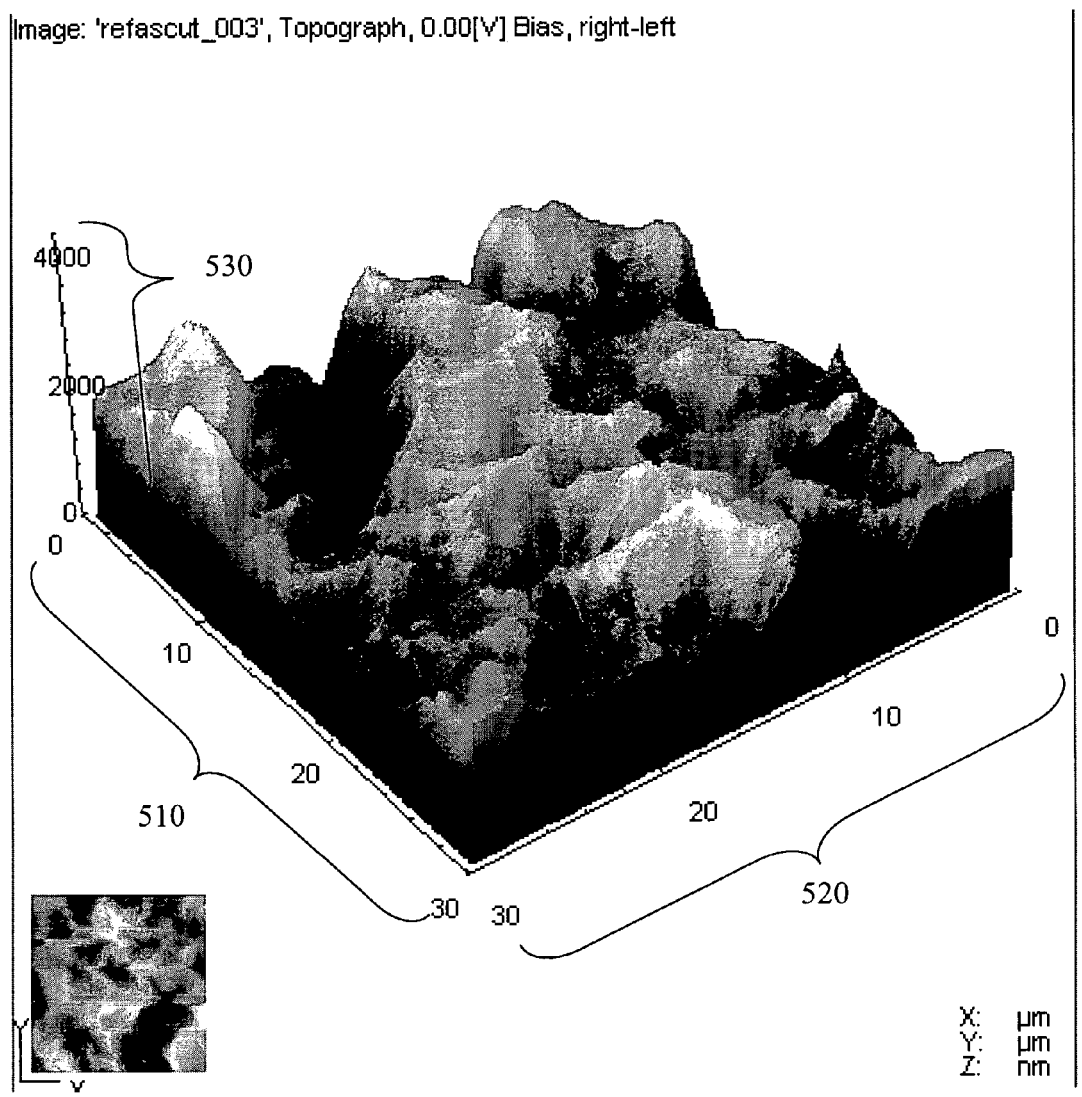

FIG. 4 is a graph of the effect of KOH concentration 410 on an etch rate 420 of p-type Si [(100) surface orientation] at the applied potential of 50 V, while performing PPD, constructed in accordance with the principles of the present invention. As one can see, at a potential of 50 V and a concentration of 50 wt %, an etching rate of more than 25 microns/min 430 was measured. Thus, it can be seen that the dependence of etching rate on the alkaline concentration is linear in solutions containing more that 10 wt % KOH.

FIGS. 5a-5d are atomic force microscope (AFM) images of "as cut" and positive potential dissolution (PPD) silicon presenting the capability to polish an as-cu surface, after PPD at 130 sec, 55V and a concentration of 32% KOH. Dimensions are indicated for the x-axis 510 in micrometers, the y-axis 520 in micrometers and the z-axis 510 in nanometers.

Figure 6A:
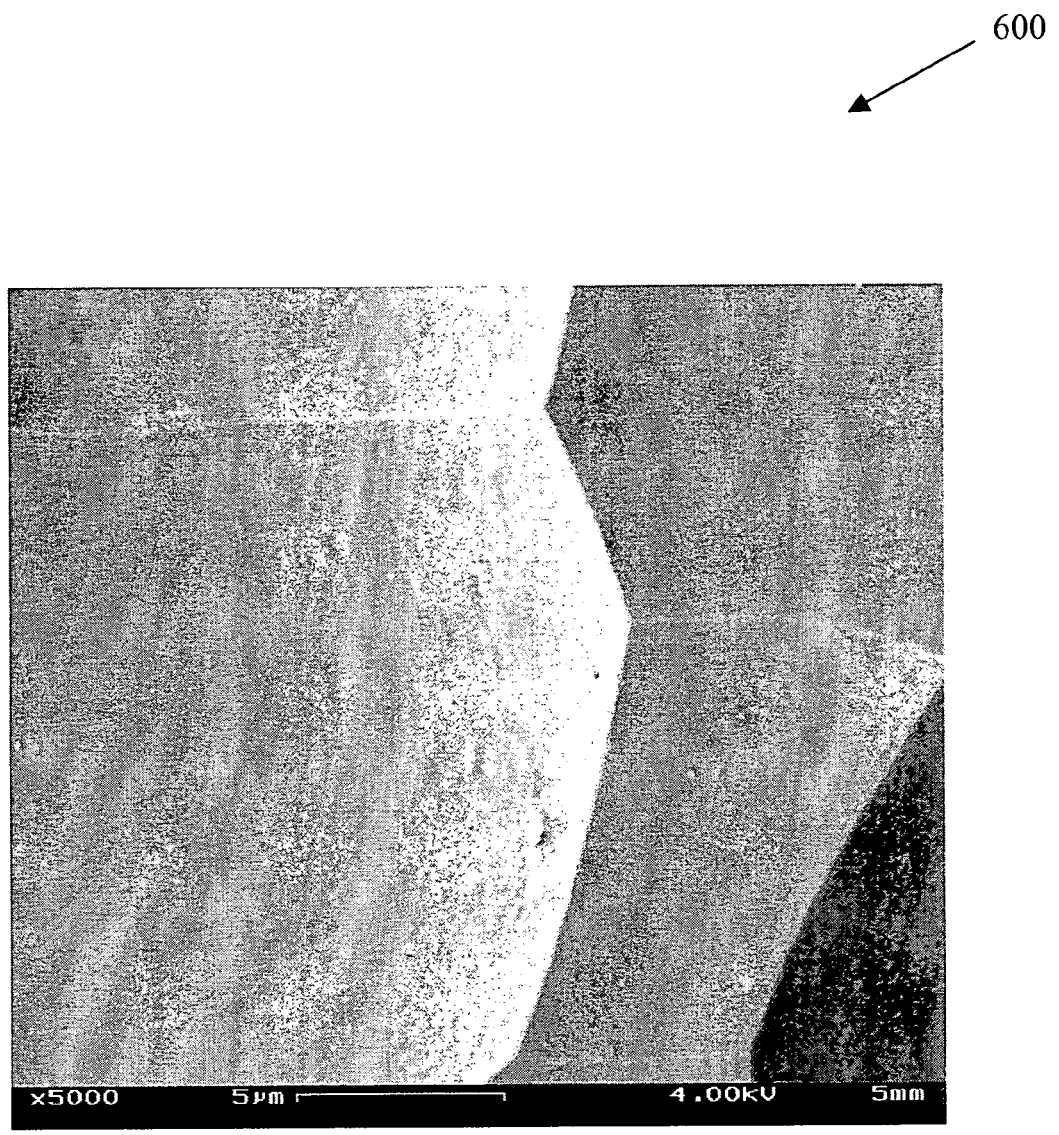
FIGS. 6a and 6b are High Resolution Scanning Electron Microscope (HRSEM) images of an "as cut" surface and polished surface via PPD.
Figure 6B:
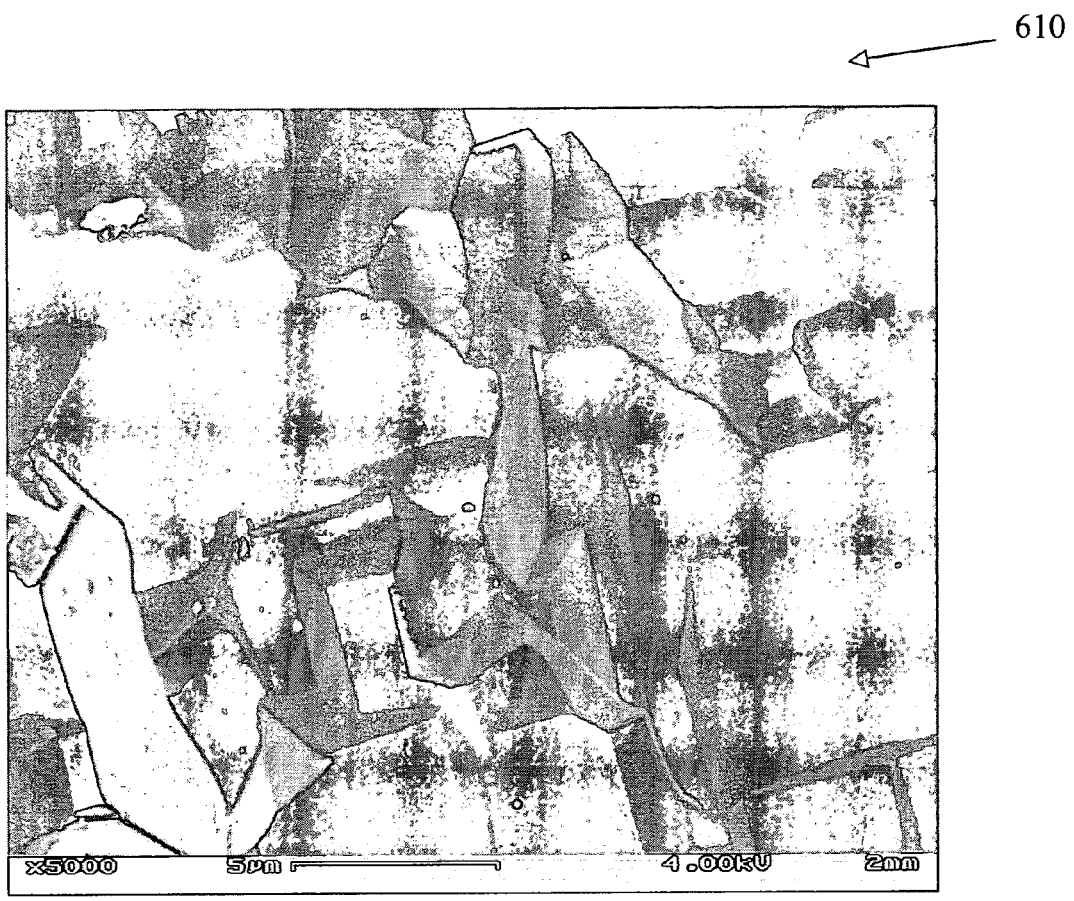

FIGS. 6a and 6b are High Resolution Scanning Electron Microscope (HRSEM) images of an "as cut" surface and polished surface, respectively, via PPD. Thus, FIG. 6a illustrates a configuration subsequent to positive potential dissolution (PPD) silicon (100), presenting the capability to polish an as-cu surface, after PPD 610 at 130 sec, 55V and a concentration of 32% KOH. FIG. 6b is an "as cut" reference 600, before application of PPD.

Figure 7A:
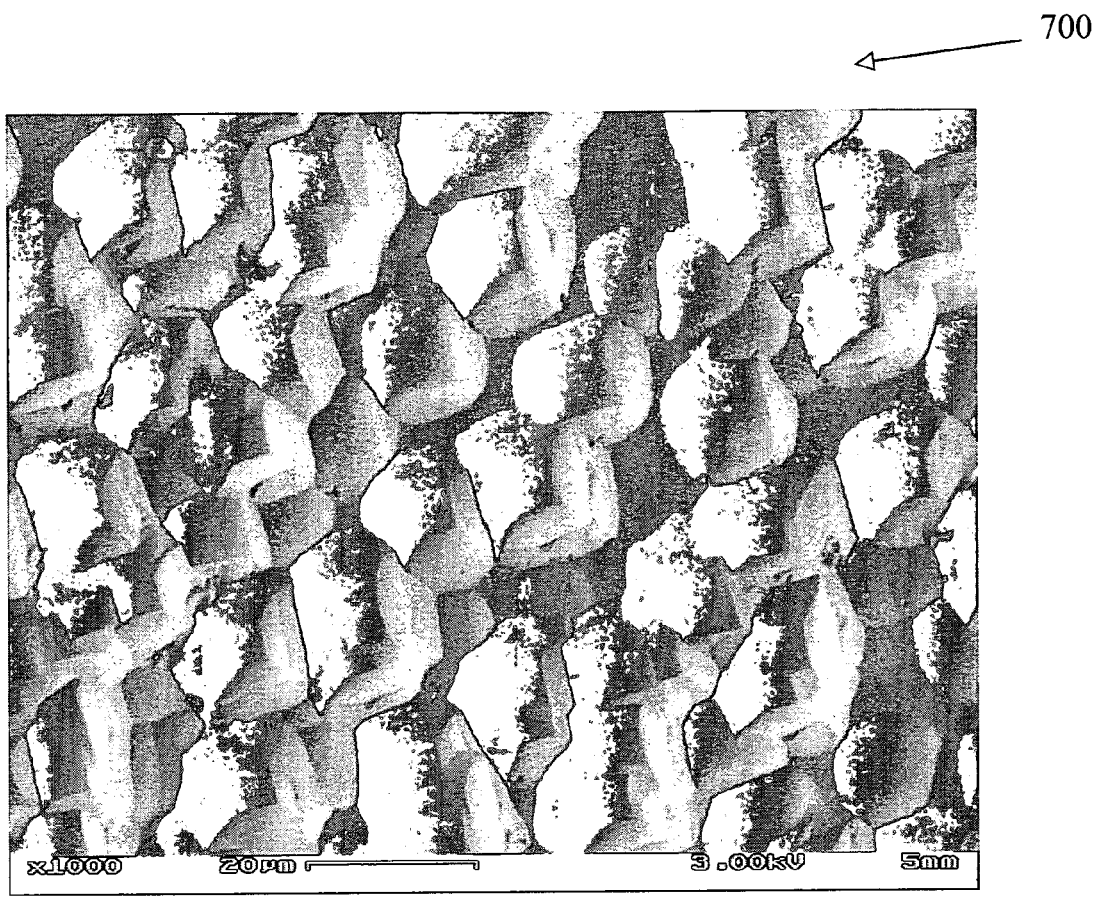
FIGS. 7a and 7b are HRSEM images of polished p type 110 which was textured via PPD.
Figure 7B:
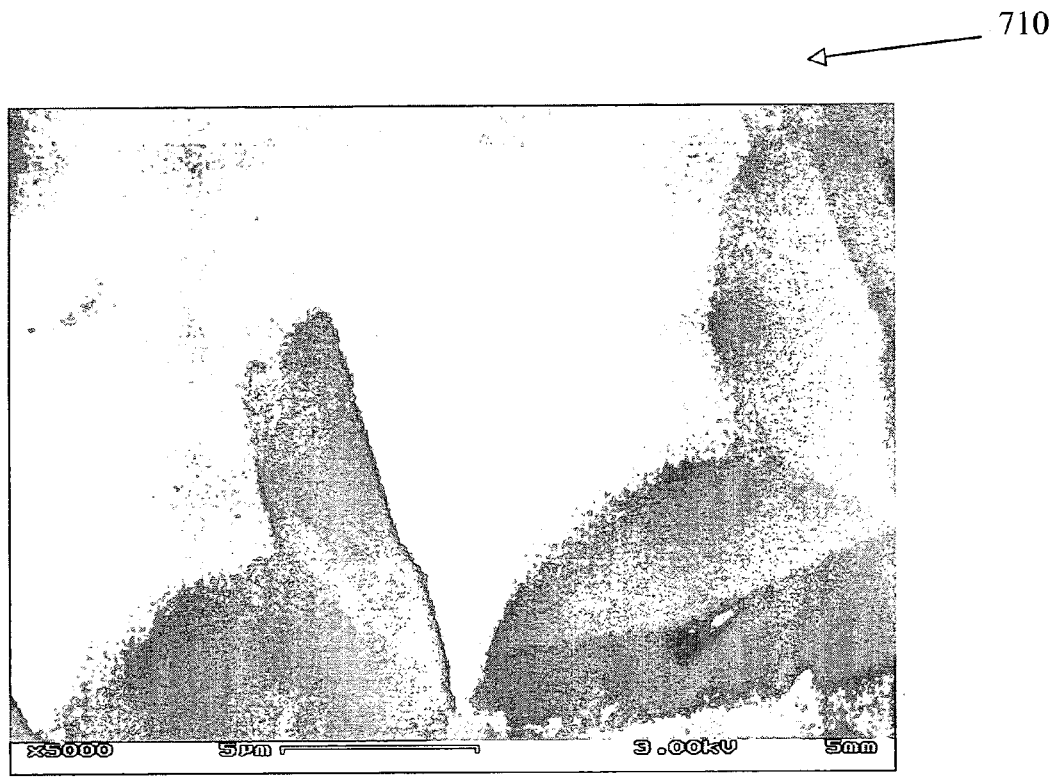

FIGS. 7a and 7b are HRSEM images of polished p type 110 which was textured via PPD. FIG. 7a illustrates HRSEM of pristine polished silicon (100) subsequent to positive potential dissolution (PPD) 700, presenting the ability to texture a polished surface within 5 minutes, after PPD process at 40 V in a solution containing 50% KOH. FIG. 7b illustrates a "zoom," close-up view of the features of the textured material 710.

It is to be understood that the phraseology and terminology employed herein are for the purpose of description, and should not be regarded as limiting.

It is important, therefore, that the scope of the invention is not construed as being limited by the illustrative embodiments set forth herein. Other variations are possible within the scope of the present invention as defined in the appended claims and their equivalents.

We claim:

1. A method for electrochemical etching of a semiconductor material using positive potential dissolution (PPD) in alkaline etching solutions without the need for toxic hydrogen fluoride, said method comprising:

subjecting one of: a polished material and an as-cut semiconductor material to an etching solution;

positively biasing said material at atypically highly positive (anodic) potentials in a voltage range between approximately plus 20 volts and plus 55 volts relative to a reference saturated calomel electrode (SCE); and etching in the trans-passive range of potentials in which passivity breaks down and fast etching occurs, wherein said fast etching is defined as any rate faster than 5 microns per minute; and specifically controlling and directing illumination by light incident upon the positively biased polished/as-cut semiconductor material surface contacted and wetted by an alkaline etching solution free from toxic hydrogen fluoride such that the specifically controlled and directed illumination of the positively biased semiconductor material surface contacted and wetted by the etching solution increases the value of the anodic current density of the semiconductor material from practically zero at the passivity state to approximately 5000 mA/cm$^2$, and such that the application of positive biasing at atypically highly positive (anodic) potentials in said voltage range, combined with specifically controlling of the semiconductor material surface contacted and wetted by the etching solution, is applied for a necessary and sufficient period of time to enable a positive synergistic effect on the rate and extent of etching of the semiconductor material, and therefore, on the type of etched semiconductor material formed therefrom.

2. The method of claim 1, wherein the rate of silicon etching is significantly increased and reaches up to 25 microns per minute by using such highly positive (anodic) biasing, above passive potentials of the silicon that is exposed to the alkaline etching solution by contact and wetting without toxic hydrogen fluoride (HF).

3. The method of claim 1, wherein said application of positive biasing at atypically highly positive (anodic) potentials in the range between plus 20 volts and plus 55 volts relative to a reference saturated calomel electrode (SCE) at which passivity breaks down, is further combined with directing illumination by light.

4. The method of claim 3, wherein said light is processed non-ambient light.

5. The method of claim 1, as applied to microelectronics.

6. The method of claim 1, as applied to micro-electromechanical systems, (MEMS).

7. The method of claim 1, as applied to the manufacturing of solar cells from semiconductor materials, involving texturing surfaces of the semiconductor materials for the objective of decreasing reflectance of incident sunlight away from the semiconductor material surfaces.

8. The method of claim 1, as applied to the manufacturing of photovoltaic panels from semiconductor materials, involving texturing surfaces of the semiconductor materials for the objective of decreasing reflectance of incident sunlight away from the semiconductor material surfaces.

9. The method of claim 1, as part of a more encompassing multi-stage method for processing or manufacturing a semiconductor material.

10. The method of claim 1, wherein said subjecting of a semiconductor material to an etching solution is combined in a bath where the counter electrode is a semiconductor as well, and further comprising negative biasing of said counter electrode in a negative potential dissolution, (NPD), process.

* * * * *